United States Patent
Spits et al.

(10) Patent No.: US 8,653,854 B2
(45) Date of Patent: Feb. 18, 2014

(54) LOW-CURRENT LOGIC-GATE CIRCUIT (75) Inventors: Erwin Spits, Utrecht (NL); Léon C. M. van den Oever, Rosmalen (NL)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/321,117

(22) PCT Filed: Jun. 15, 2010

(86) PCT No.: PCT/EP2010/058388
§ 371 (c)(1),
(2), (4) Date: Jan. 24, 2012

(87) PCT Pub. No.: WO2010/146051
PCT Pub. Date: Dec. 23, 2010

(65) Prior Publication Data
US 2012/0112793 A1 May 10, 2012

(30) Foreign Application Priority Data
Jun. 17, 2009 (EP) ..................................... 09162990

(51) Int. Cl.
*H03K 19/094* (2006.01)
(52) U.S. Cl.
USPC .............................. 326/83; 326/112; 326/114
(58) Field of Classification Search
USPC ................. 326/81–83, 86–87, 112–114, 122; 327/108–109, 333
See application file for complete search history.

(56) References Cited

U.S. PATENT DOCUMENTS

| | | | | |
|---|---|---|---|---|
| 3,700,981 A | | 10/1972 | Masuhara et al. | |
| 3,775,693 A | | 11/1973 | Proebsting | |
| 4,365,172 A | * | 12/1982 | Prater | 326/87 |
| 4,459,497 A | * | 7/1984 | Kuo et al. | 327/51 |
| 4,978,904 A | | 12/1990 | Fitzpatrick et al. | |
| 5,091,662 A | | 2/1992 | Yung et al. | |
| 5,598,106 A | * | 1/1997 | Kawasaki et al. | 326/21 |
| 5,910,737 A | | 6/1999 | Kesler | |
| 6,239,623 B1 | * | 5/2001 | Tsutsui | 326/119 |
| 7,202,863 B2 | * | 4/2007 | Kimura et al. | 345/204 |
| 7,550,998 B2 | * | 6/2009 | Brazis et al. | 326/83 |
| 7,750,705 B2 | * | 7/2010 | Ueno | 327/198 |
| 2003/0020520 A1 | * | 1/2003 | Miyake et al. | 327/112 |
| 2005/0040852 A1 | * | 2/2005 | Mentze et al. | 326/81 |
| 2005/0189968 A1 | * | 9/2005 | Brazis et al. | 327/112 |
| 2007/0297225 A1 | * | 12/2007 | Tanzawa | 365/185.01 |
| 2008/0150577 A1 | * | 6/2008 | Ueno | 326/33 |

FOREIGN PATENT DOCUMENTS

| | | |
|---|---|---|
| EP | 0 415 768 A2 | 3/1991 |
| GB | 1 436 988 A | 5/1976 |
| JP | 61-161020 A | 7/1986 |
| JP | 2-280413 A | 11/1990 |

* cited by examiner

*Primary Examiner* — Shawki Ismail
*Assistant Examiner* — Christopher Lo
(74) *Attorney, Agent, or Firm* — Slater & Matsil, L.L.P.

(57) ABSTRACT

A circuit includes E-mode transistors with gate-source junction, a D-mode transistor with gate-source junction. A component generates a voltage drop between the source of the D-mode transistor and the drain of an E mode transistor provided as a signal output. A connection is made between this drain of the E-mode transistor and the gate of the D-mode transistor, and a signal input at the gates of the E-mode transistors.

24 Claims, 4 Drawing Sheets

LOW-CURRENT LOGIC-GATE CIRCUIT

This patent application is a national phase filing under section 371 of PCT/EP2010/058388, filed Jun. 15, 2010, which claims the priority of European patent application 09162990.7, filed Jun. 17, 2009, each of which is incorporated herein by reference in its entirety.

TECHNICAL FIELD

This invention is concerned with low-current logic-gate circuits for applications in GaAs technology.

BACKGROUND

Conventional logic circuits in GaAs technology use a transistor in combination with a large resistor. These circuits require both high input drive currents and high currents in the on-state because of the required voltage drop over the resistor. Furthermore, the resistor occupies a large chip area to provide the desired large resistance.

SUMMARY OF THE INVENTION

In one aspect, this invention presents a low-current logic-gate circuit that can be realized in GaAs technology.

The circuit according to the invention can be realized in GaAs technology and does not require large currents. Several components available in this technology, especially merged or stacked FET-HBT integration schemes, often called BiFET or BiHEMT and containing both HBT and FET or P-HEMT devices on a single GaAs substrate, can be used to render a low-current circuitry. The low-current logic-gate circuit, which makes use of E-mode (enhancement) and D-mode (depletion) FETs comprising gate-source junctions and/or gate-drain junctions, delivers the desired voltages while always limiting its currents to a minimum.

Input transistors and a feedback transistor, each comprising a source, a drain and a gate controlling a channel between source and drain and each having a gate-source junction are used in the circuit. The input transistors are E-mode transistors, which are conducting between the source and the drain if the gate-source voltage is more (larger) positive than a positive threshold voltage and which are not conducting between the source and the drain if the gain-source voltage is lower. The feedback transistor is a D-mode transistor, which is not conducting between the source and the drain if the gate-source voltage is more negative than a negative threshold voltage and which is conducting between the source and the drain in the case of a gate-source voltage above the threshold voltage (less negative, zero or positive). The transistors can be symmetric with respect to source and drain, so that a gate-source junction and a similar gate-drain junction are available.

The source of the feedback transistor is connected to the drain of an input transistor via a component that generates a voltage drop. The drain of this input transistor is connected to the gate of the feedback transistor. Thus a feedback loop connecting the source of the feedback transistor to the gate of the feedback transistor is formed. The source of the input transistor is connected to a first level of a supply voltage, and the drain of the feedback transistor is connected to a second level of the supply voltage. The drain of the input transistor is provided for an output signal. The gate of each of the input transistors is provided for an input signal. The component that generates a voltage drop between the source of the feedback transistor and the drain of the input transistor can especially be provided by a gate-source junction or by a gate-drain junction of a further transistor. The junctions of the further transistor may be switched in parallel by connecting source and drain. Gate-source junctions or gate-drain junctions of further transistors can be connected in series to obtain the adequate value of the voltage drop. Instead, the component that generates a voltage drop can be provided by a diode, especially a diode formed by the basis and the emitter or collector of a bipolar or heterobipolar transistor. A circuit of this latter design is especially suitable as an output buffer of the low-current logic-gate circuit to drive a high-impedance load like a depletion-mode FET or a depletion-mode P-HEMT, for example.

A further E-mode input transistor is provided to form an input logic. To this purpose, the drain of the further input transistor can be connected to the source of the first input transistor, or the source and the drain of the further input transistor can be connected to the source and the drain, respectively, of the first input transistor. The source of the further input transistor is provided to be connected to the first voltage level of the supply voltage. The gates of the first input transistor and the further input transistor are provided for input signals, and the drain of the first input transistor is provided for an output signal. Additional input transistors can be provided for various logical operations.

BRIEF DESCRIPTION OF THE DRAWINGS

These and other features and advantages of the low-current logic-gate circuit will become apparent from the following detailed description of examples in conjunction with the appended figures.

The following list of reference symbols may be used in conjunction with the drawings:
1 source of the input transistor
2 drain of the input transistor
3 gate of the input transistor
4 source of the feedback transistor
5 drain of the feedback transistor
6 gate of the feedback transistor
7 connection
8 source of a further transistor
9 drain of a further transistor
10 gate of a further transistor
11 source of a further transistor
12 drain of a further transistor
13 gate of a further transistor
14 further diode
15 source of the input transistor
16 drain of the input transistor
17 gate of the input transistor
18 source of the feedback transistor
19 drain of the feedback transistor
20 gate of the feedback transistor
21 connection
22 source of a further input transistor
23 drain of a further input transistor
24 gate of a further input transistor
25 source of a further input transistor 26 drain of a further input transistor
27 gate of a further input transistor
D feedback transistor
D1 feedback transistor
E input transistor
E1 further transistor
E2 further transistor
E3 input transistor
E4 further input transistor
E5 further input transistor
IN input
OUT output
$V_{DD}$ high potential level of a supply voltage
$V_{SS}$ low potential level of a supply voltage

DETAILED DESCRIPTION OF ILLUSTRATIVE EMBODIMENTS

Figure 1:
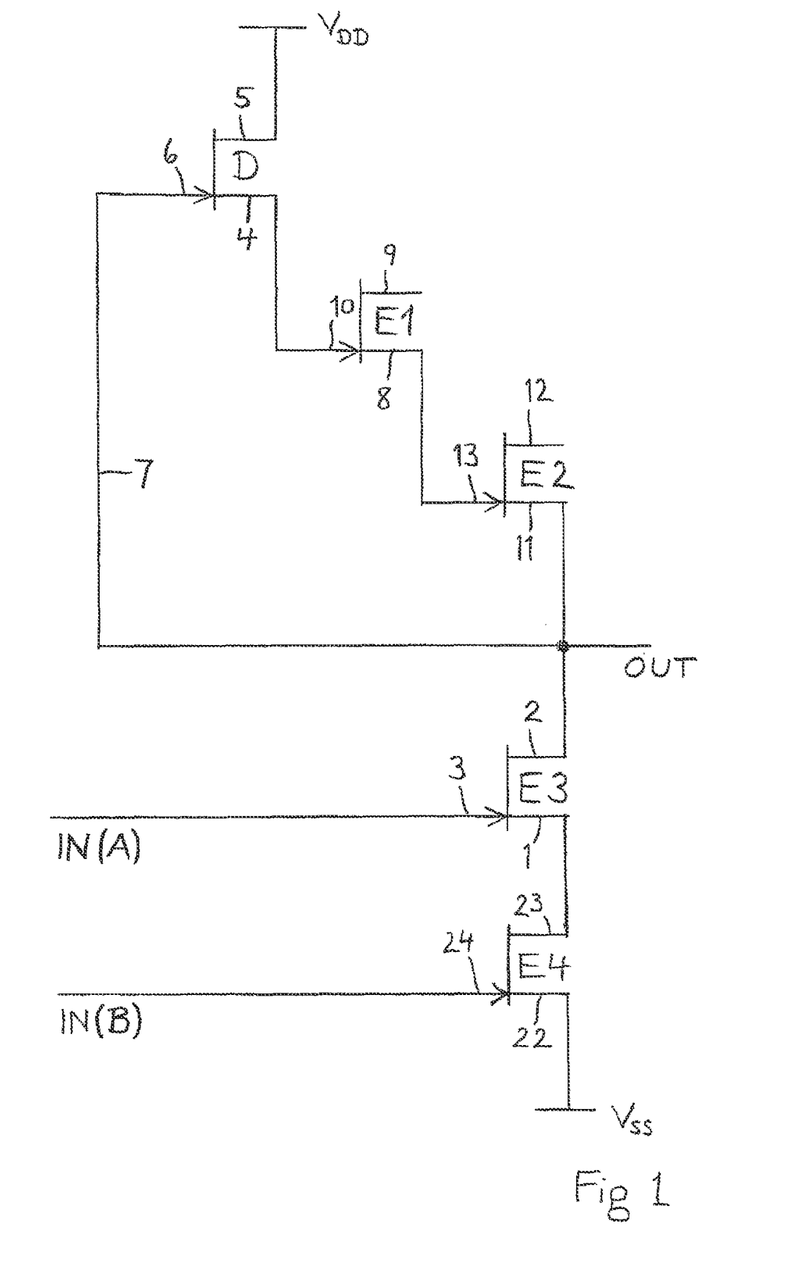
FIG. 1 shows a circuit diagram of an embodiment of a low-current logic-gate circuit comprising a NAND logic.

FIG. 1 shows a first embodiment of the low-current logic-gate circuit. The transistors appearing in the circuit are a kind of field-effect transistors comprising source, drain and gate as well as a diode formed by a junction between gate and source or drain. The transistors are therefore represented in the circuit diagram by symbols used for n-channel JFETs, but other types of transistors having a comparable structure can be used as well. In the examples shown in the figures, the gate-source junctions of the transistors are used.

The transistors designated with a D (D-mode, depletion mode) are characterized by a negative threshold voltage. If a gate-source voltage is applied that is larger negative (which means negative and of a larger absolute value) than the negative threshold voltage, the source-drain path through the channel of the transistor is non-conducting. If the transistor is considered as a switch, the switch is open if the gate-source voltage is larger negative than the threshold voltage. This type of transistor may therefore be characterized as "normally-on". If the gate-source voltage is not as negative as the threshold voltage or if it is zero or positive, the source-drain path is conducting: the switch is closed.

The transistors designated with an E as E-mode (enhancement mode) transistors are characterized by a positive threshold voltage. The E-mode transistors are conducting between source and drain if the gate-source voltage is larger than the positive threshold voltage and therefore the switch is closed. If the gate-source voltage is lower than the positive threshold voltage or if it is zero or negative, the transistor is non-conducting and therefore the switch is open. Thus, the E-mode transistors can be characterized as "normally-off".

In the following, the D-mode transistor D in the circuit of FIG. 1 will be referred to as feedback transistor and the E-mode transistors E3, E4 as input transistors. The source 1 of the input transistor E3 is connected to the drain 23 of the further input transistor E4. The source 22 of the further input transistor E4 is connected to ground or the lower potential $V_{SS}$ of a supply voltage. The drain 2 of the first input transistor E3 is provided for an output signal OUT. The gates 3, 24 of the input transistors E3, E4 are provided for input signals IN(A), IN(B), which may be logical signals. The drain 2 of the first input transistor E3 is connected via the connection 7 with the gate 6 of the feedback transistor D. The drain 5 of the feedback transistor D is connected to the higher potential $V_{DD}$ of the supply voltage.

The drain 2 of the first input transistor E3 is connected with the source 4 of the feedback transistor D via a component that generates a voltage drop, which is formed by two further E-mode transistors E1, E2 in this embodiment. The source 4 of the feedback transistor D is connected to the gate 10 of the first further transistor E1. The source 8 of the first further transistor E1 is connected to the gate 13 of the second further transistor E2. The source 11 of the second further transistor E2 is connected to the drain 2 of the first input transistor E3. The drain 9 of the first further transistor E1 and the drain 12 of the second further transistor E2 can be left open, as shown in FIG. 1 by way of example. Instead, the drain 9 of the first further transistor E1 can be connected to the source 8 of the first further transistor E1, and/or the drain 12 of the second further transistor E2 can be connected to the source 11 of the second further transistor E2, so that the gate-source junction and the gate-drain junction of the transistors are switched parallel.

The connections can be adapted to individual requirements, according to the characteristics of the transistors. In the example of FIG. 1, the gate-source junctions of the further transistors E1, E2 are connected in series between the source 4 of the feedback transistor D and the drain 2 of the first input transistor E3. Although the component that generates a voltage drop can generally be provided by any suitable number of devices, the transistors of a GaAs BiFET process are typically dimensioned in such a fashion that two gate-source junctions connected in series may render an appropriate value of the voltage drop in question. The circuit secures a reliable low-current operation, irrespective of changing environmental and operating conditions. The operation of this circuit is as follows.

When high voltage levels corresponding to high logical input signals IN are applied both to the gate 3 of the first input transistor E3 and to the gate 24 of the further input transistor E4, these voltages will drive the input transistors E3, E4 into a conducting mode. The corresponding switches between source and drain are therefore closed, and the ground potential $V_{SS}$ is connected with the gate 6 of the feedback transistor D. The voltages of the input signals IN(A), IN(B) only need to be high enough for the gate-source voltages of the input transistors E3, E4 to be larger than their threshold voltages. The voltage over the component that generates the voltage drop in the feedback loop, which is formed by the further transistors E1 and E2, makes a current flow through the circuit branch of the series of transistors D, E1, E2, E3, and E4. The current through the further transistors E1 and E2 causes a voltage drop, so that the voltage level at the gate 6 of the feedback transistor D is lower than the voltage level at the source 4 of the feedback transistor D. The diodes of the gate-source junctions of the further transistors E1, E2 are dimensioned in such a manner that the voltage drop causes the feedback transistor D to be switched to a region around threshold (the gate-source voltage of the feedback transistor D being comparable to the threshold voltage). Consequently, the current flowing through the transistors D, E1, E2, E3, and E4 is very low, while the voltage level at the drain 2 of the first input transistor E3 is essentially on ground level ($V_{SS}$). Thus the high input signals IN(A), IN(B) are transformed into a low output signal OUT.

When a low voltage level is applied to the gate 3 of the first input transistor E3 or to the gate 24 of the further input transistor E4, the corresponding gate-source voltage is below the threshold voltage, so that the input transistor is non-conducting, and almost no current flows through the source-drain path of the input transistor. The only current occurring in the circuit branch of the series of transistors D, E1 and E2 is a very small current through the output provided for the output signal OUT. The further transistors E1 and E2 are dimensioned in such a manner that the voltage drop over their gate-source junctions be low enough for the negative gate-source voltage of the feedback transistor D to be above the more negative threshold voltage. Therefore the feedback transistor D is conducting between source and drain, and the corresponding switch is closed. Accordingly, the output signal OUT is on a high level. Thus at least one low input signal IN(A) or IN(B) renders a high output signal OUT, and this circuit therefore forms a NAND logic.

Figure 2:
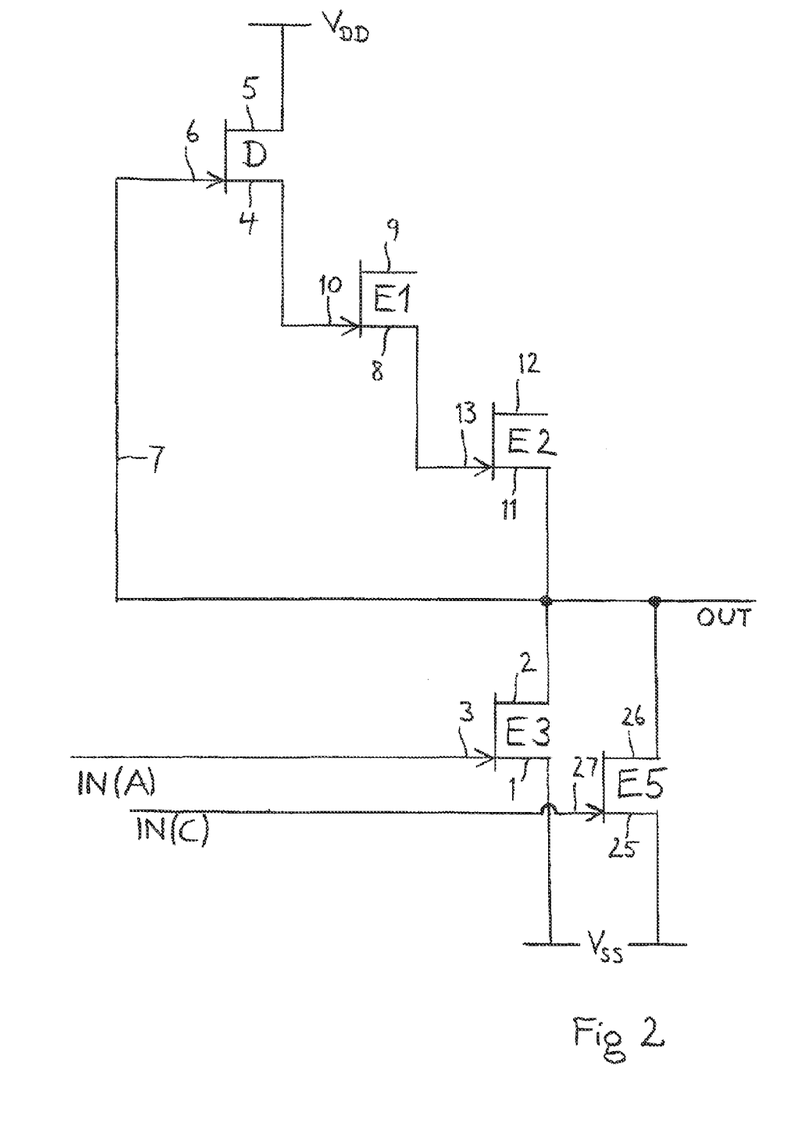
FIG. 2 shows a circuit diagram of a further embodiment comprising a NOR logic.

FIG. 2 shows a further embodiment of the low-current logic-gate circuit. The source 1 of the first input transistor E3 and the source 25 of the further input transistor E5 are connected to ground or the lower potential $V_{SS}$ of a supply voltage. The drain 2 of the first input transistor E3 is connected to the drain 26 of the further input transistor E5 and is provided for an output signal OUT. The gates 3, 27 of the input transistors E3, E5 are provided for input signals IN(A), IN(C), which may be logical signals. The drain 2 of the first input transistor E3 is connected via the connection 7 with the gate 6 of the feedback transistor D. The other components of this embodiment are similar to the circuit of FIG. 1. If a high voltage level is present at least at one of the gates 3, 27 of the input transistors E3, E5, the output signal will be low. Only if both input signals IN(A), IN(C) are low, the output signal OUT will be high. Thus at least one high input signal IN(A) or IN(C) renders a low output signal OUT, and this circuit therefore forms a NOR logic.

Figure 3:
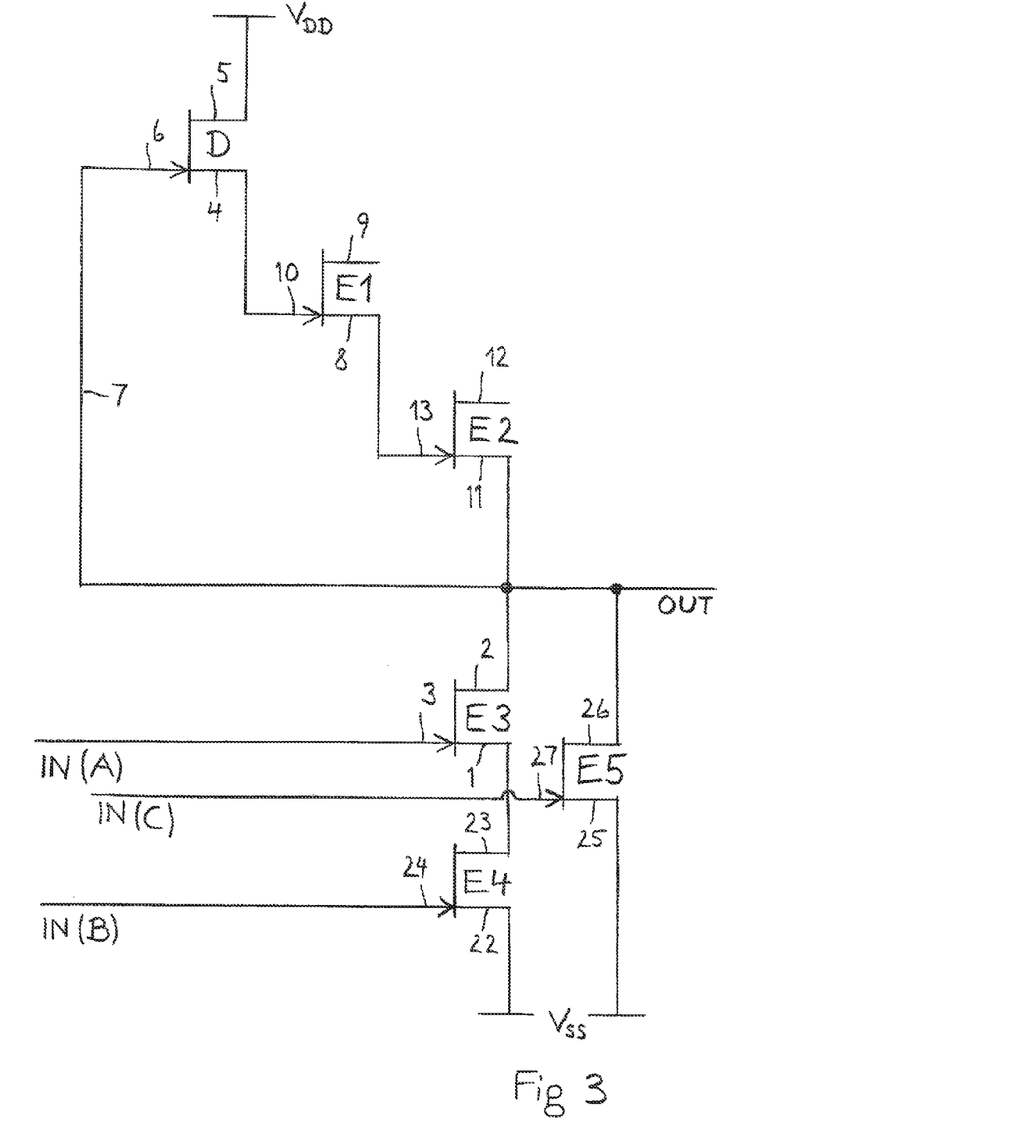
FIG. 3 shows a circuit diagram of a further embodiment comprising a combined NAND and NOR logic.

FIG. 3 shows a further embodiment of the low-current logic-gate circuit comprising both the NAND logic of FIG. 1 and the NOR logic of FIG. 2. One further input transistor E4 is arranged in the same way as in the embodiment of FIG. 1 with respect to the first input transistor E3, so that the input transistors E3, E4 form a NAND logic corresponding to the circuit of FIG. 1. Another further input transistor E5 is arranged in the same way as in the embodiment of FIG. 2 with respect to the first input transistor E3, so that the input transistors E3, E5 form a NOR logic corresponding to the circuit of FIG. 2. The embodiment of FIG. 3, compared with the previously described embodiments, shows how it is possible to combine several E-mode input transistors to form more complex NAND and NOR logics. The NAND logic can be converted into an AND logic and the NOR logic into an OR logic by means of an inverter, which changes the output signal from high to low or from low to high. To this end the low-current inverter circuit of FIG. 4 is especially appropriate.

Figure 4:
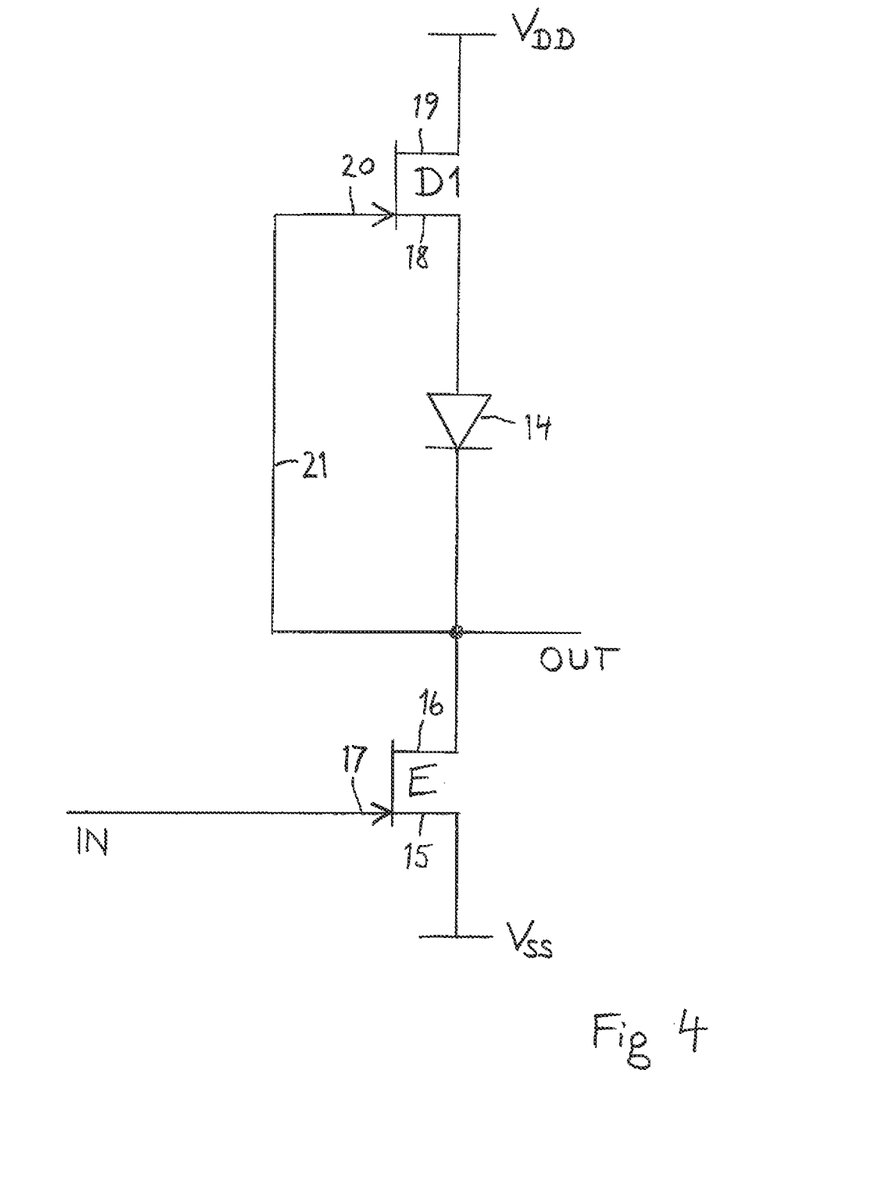
FIG. 4 shows a circuit diagram of a low-current buffer circuit.

FIG. 4 shows a low-current circuit, which is similar to the circuit of FIG. 1 except for the presence of only one input transistor E and a different realization of the component that generates a voltage drop, connected between the drain 16 of the input transistor E and the source 18 of the feedback transistor D1. In the circuit of FIG. 4, the component that generates a voltage drop is provided by a further diode 14, which may be a diode formed by the basis and the emitter or collector of a bipolar transistor or a heterobipolar transistor. The bipolar or heterobipolar transistor can also be produced within a GaAs BiFET process.

The circuit according to FIG. 4 is especially suited to be applied as a buffer, connected to the output of a circuit according to one of FIG. 1, 2 or 3. In this case, the drain 2 of the first input transistor E3 can be connected with the gate 17 of the input transistor E of the buffer circuit according to FIG. 4. It is not necessary to have a direct, immediate connection between these circuits; instead, further stages of the circuitry may be connected between a circuit according to one of FIG. 1, 2 or 3 and a circuit according to FIG. 4. Furthermore, two or more logic stages according to one of FIG. 1, 2 or 3 can be provided preceding the output stage formed by a buffer circuit according to FIG. 4.

When voltage levels are applied to the gates of the input transistors in such a manner that the logic renders an output signal which, applied to the buffer circuit of FIG. 4, sets the gate 17 of the input transistor E on ground level, the input transistor E of the buffer circuit is non-conducting between source 15 and drain 16, and the corresponding switch is open. In typical applications of this circuitry, there is a high-impedance load at the output of the buffer circuit provided for an output signal OUT (drain 16 of the input transistor E of the buffer circuit). Because of the high impedance, only a very low current flows through the further diode 14. The voltage drop over the further diode 14 is therefore very low, and the gate-source voltage of the feedback transistor D1 of the buffer circuit is less negative than its threshold voltage. This means that the feedback transistor D1 is conducting between source 18 and drain 19, the corresponding switch is closed, and the voltage level at the drain 16 of the input transistor E of the buffer circuit is high.

When voltage levels are applied to the gates of the input transistors in such a manner that the logic renders an output signal which, applied to the buffer circuit of FIG. 4, sets the gate 17 of the input transistor E on a high voltage level, the current through the feedback transistor D1 and the further transistors E1, E2 in the logic circuit is essentially the low gate current of the input transistor E of the buffer circuit of FIG. 4. The input transistor E of the buffer circuit is conducting between source 15 and drain 16. Only a low current flows through the further diode 14. The current through the feedback transistor D1 of the buffer circuit and the further diode 14 pulls the drain voltage of the input transistor E of the buffer circuit to a low voltage level. The voltage drop over the further diode 14 is sufficiently high, so that the gate-source voltage of the feedback transistor D1 of the buffer circuit allows only a low current to flow through the feedback transistor D1.

Further logic gates can be realized by parallel and/or serial arrangements of low-current logic-gate circuits.

The input stage of the circuitry, formed by one or several of the low-current circuits according to FIG. 1, 2 or 3, may comprise a further diode similar to the one shown in the corresponding circuit loop of FIG. 4 instead of the further transistors E1 and E2. This further diode may also be a diode of a bipolar or heterobipolar transistor. The output stage of the circuitry, formed by the low-current buffer circuit of FIG. 4, may comprise one or more further gate-source and/or gate-drain junctions of transistors in the feedback loop instead of the further diode 14. But it may be advantageous to have the further diode 14 in the buffer circuit, because in this case the current may be better adapted to the requirements of the circuit components that are driven by the buffer. The further diode 14 of the buffer circuit is preferably a diode with device parameters that result in a lower voltage drop, giving more current through the feedback transistor in the point of operation. This enables the circuit to drive a load as hard as possible so that the voltage loss over the load is minimal. A high-impedance load may be a FET or a P-HEMT, for example. The use of the gate-source and/or gate-drain junctions of transistors in the feedback loop, according to the further transistors E1 and E2 in FIGS. 1, 2 and 3, renders the lowest current consumption, whereas the use of a diode in the feedback loop, according to the further diode 14 in FIG. 4, improves the drive capability of the low-current circuit.

The invention claimed is:
1. A low-current logic-gate circuit, comprising:
an input transistor and a feedback transistor, each comprising a source, a drain and a gate that is provided to control a channel between the source and the drain, and each having a gate-source junction,
wherein the input transistor conducts between the source and the drain if a gate-source-voltage that is applied between the gate and the source is more positive than a positive threshold voltage, and does not conduct between the source and the drain otherwise,
wherein the feedback transistor does not conduct between the source and the drain if a gate-source-voltage that is applied between the gate and the source is more negative than a negative threshold voltage, and conducting between the source and the drain otherwise,
a component that generates a voltage drop between the source of the feedback transistor and the drain of the input transistor,
a connection between the drain of the input transistor and the gate of the feedback transistor,
a further input transistor comprising a source, a drain, a gate that is provided to control a channel between the source and the drain, and a gate-source junction,
wherein the further input transistor conducts between the source and the drain if a gate-source-voltage that is applied between the gate and the source is more positive than a positive threshold voltage, and does not conduct between the source and the drain otherwise,
wherein the source of the further input transistor is to be connected to a first voltage level of a supply voltage,
wherein the drain of the feedback transistor is to be connected to a second voltage level of the supply voltage,
wherein the gates of the input transistor and the further input transistor are provided for input signals,
wherein the drain of the input transistor is provided for an output signal, wherein the drain of the further input transistor is connected to the source of the input transistor,
wherein the circuit further comprises a second further input transistor comprising a source, a drain, a gate that is provided to control a channel between the source and the drain, and a gate-source junction,
wherein the second further input transistor conducts between the source and the drain if a gate-source-voltage that is applied between the gate and the source is more positive than a positive threshold voltage, and does not conduct between the source and the drain otherwise,
wherein the source of the second further input transistor is connected to the source of the further input transistor, and
wherein the drain of the second further input transistor is connected to the drain of the input transistor.

2. The low-current logic-gate circuit of claim 1, further comprising a further transistor comprising a source, a drain, a gate that is provided to control a channel between the source and the drain, and a gate-source junction,
wherein the component that generates the voltage drop comprises the gate-source junction of the further transistor.

3. The low-current logic-gate circuit of claim 1, further comprising:
at least two further transistors, each further transistor comprising a source, a drain, a gate that is provided to control a channel between the source and the drain, and a gate-source junction,
wherein the component that generates the voltage drop comprises the gate-source junctions of the further transistors connected in series.

4. The low-current logic-gate circuit of claim 1 wherein the component that generates the voltage drop comprises a further diode.

5. The low-current logic-gate circuit of claim 1, further comprising:
a buffer circuit comprising:

an input transistor and a feedback transistor, each comprising a source, a drain and a gate that is provided to control a channel between the source and the drain, and each having a gate-source junction,
wherein the input transistor conducts between the source and the drain if a gate-source voltage that is applied between the gate and the source is more positive than a positive threshold voltage, and does not conduct between the source and the drain otherwise,
the feedback transistor does not conduct between the source and the drain if a gate-source voltage that is applied between the gate and the source is more negative than a negative threshold voltage, and conducts between the source and the drain otherwise,
a component that generates a voltage drop between the source of the feedback transistor and the drain of the input transistor, and
a connection between the drain of the input transistor and the gate of the feedback transistor,
wherein the source of the input transistor is connected to a first voltage level of a supply voltage node,
wherein the drain of the feedback transistor is connected to a second voltage level of the supply voltage node,
wherein the drain of the input transistor of the logic-gate circuit is connected to the gate of the input transistor of the buffer circuit, and
wherein the drain of the input transistor of the buffer circuit is provided for an output signal.

6. The low-current logic-gate circuit of claim 1, wherein the input transistor, feedback transistor and further input transistor are devices of a BiFET technology in GaAs.

7. The low-current logic-gate circuit of claim 1, wherein the output signal is provided to drive a high-impedance load.

8. The low-current logic-gate circuit of claim 7, wherein the high-impedance load comprises a FET or a P-HEMT.

9. The low-current logic-gate circuit of claim 4, wherein the further diode comprises a bipolar transistor.

10. The low-current logic-gate circuit of claim 4, wherein the further diode comprises a heterobipolar transistor.

11. A low-current logic-gate circuit, comprising:
an input transistor and a feedback transistor, each comprising a source, a drain and a gate that is provided to control a channel between the source and the drain, and each having a gate-source junction,
wherein the input transistor conducts between the source and the drain if a gate-source-voltage that is applied between the gate and the source is more positive than a positive threshold voltage, and does not conduct between the source and the drain otherwise,
wherein the feedback transistor does not conduct between the source and the drain if a gate-source-voltage that is applied between the gate and the source is more negative than a negative threshold voltage, and conducting between the source and the drain otherwise,
a component that generates a voltage drop between the source of the feedback transistor and the drain of the input transistor,
a connection between the drain of the input transistor and the gate of the feedback transistor,
a further input transistor comprising a source, a drain, a gate that is provided to control a channel between the source and the drain, and a gate-source junction,
at least two further transistors, each further transistor comprising a source, a drain, a gate that is provided to control a channel between the source and the drain, and a gate-source junction, wherein the further input transistor conducts between the source and the drain if a gate-source-voltage that is applied between the gate and the source is more positive than a positive threshold voltage, and does not conduct between the source and the drain otherwise, wherein either the drain of the further input transistor is connected to the source of the input transistor or the source and the drain of the further input transistor are connected to the source and the drain, respectively, of the input transistor, wherein the source of the further input transistor is to be connected to a first voltage level of a supply voltage, wherein the drain of the feedback transistor is to be connected to a second voltage level of the supply voltage, wherein the gates of the input transistor and the further input transistor are provided for input signals, wherein the drain of the input transistor is provided for an output signal, and wherein the component that generates the voltage drop comprises the gate-source junctions of the further transistors connected in series, and a buffer circuit comprising:

an input transistor and a feedback transistor, each comprising a source, a drain and a gate that is provided to control a channel between the source and the drain, and each having a gate-source junction, wherein the input transistor conducts between the source and the drain if a gate-source voltage that is applied between the gate and the source is more positive than a positive threshold voltage, and does not conduct between the source and the drain otherwise, the feedback transistor does not conduct between the source and the drain if a gate-source voltage that is applied between the gate and the source is more negative than a negative threshold voltage, and conducts between the source and the drain otherwise, a component that generates a voltage drop between the source of the feedback transistor and the drain of the input transistor, and a connection between the drain of the input transistor and the gate of the feedback transistor, wherein the source of the input transistor is connected to a first voltage level of a supply voltage node, wherein the drain of the feedback transistor is connected to a second voltage level of the supply voltage node, wherein the drain of the input transistor of the logic-gate circuit is connected to the gate of the input transistor of the buffer circuit, and wherein the drain of the input transistor of the buffer circuit is provided for an output signal.

12. The low-current logic-gate circuit of claim 11, wherein the drain of the further input transistor is connected to the source of the input transistor, the circuit further comprising:

a second further input transistor comprising a source, a drain, a gate that is provided to control a channel between the source and the drain, and a gate-source junction, the second further input transistor conducts between the source and the drain if a gate-source-voltage that is applied between the gate and the source is more positive than a positive threshold voltage, and does not conduct between the source and the drain otherwise, the source of the second further input transistor being connected to the source of the further input transistor, and the drain of the second further input transistor being connected to the drain of the input transistor.

13. The low-current logic-gate circuit of claim 11, further comprising a further transistor comprising a source, a drain, a gate that is provided to control a channel between the source and the drain, and a gate-source junction, wherein the component that generates the voltage drop comprises the gate-source junction of the further transistor.

14. The low-current logic-gate circuit of claim 11, wherein the component that generates the voltage drop comprises a further diode.

15. The low-current logic-gate circuit of claim 14, wherein the further diode comprises a bipolar transistor.

16. The low-current logic-gate circuit of claim 14, wherein the further diode comprises a heterobipolar transistor.

17. The low-current logic-gate circuit of claim 11, wherein the input transistor, feedback transistor and further input transistor are devices of a BiFET technology in GaAs.

18. The low-current logic-gate circuit of claim 11, wherein the output signal is provided to drive a high-impedance load.

19. The low-current logic-gate circuit of claim 18, wherein the high-impedance load comprises a FET or a P-HEMT.

20. A circuit comprising:

an enhancement mode transistor with a gate-source junction;

a depletion mode transistor with a gate-source junction;

a component generating a voltage drop between a source of the depletion mode transistor and a drain of the enhancement mode transistor;

a connection between the drain of the enhancement mode transistor and a gate of the depletion mode transistor; and a further enhancement mode transistor with a gate-source junction;

wherein a source of the further enhancement mode transistor is to be connected to a first voltage level of a supply voltage;

wherein a drain of the depletion mode transistor is to be connected to a second voltage level of the supply voltage;

wherein either a source of the enhancement mode transistor is connected to a drain of the further enhancement mode transistor, or a source and the drain of the enhancement mode transistor are connected to the source and a drain, respectively, of the further enhancement mode transistor;

wherein the component generating the voltage drop comprises a second further enhancement mode transistor with a gate-source junction and a third further enhancement mode transistor with a gate-source junction;

wherein a gate of the second further enhancement mode transistor is coupled to the source of the depletion mode transistor;

wherein a gate of the third further enhancement mode transistor is coupled to a source of the second further enhancement mode transistor; and wherein the drain of the enhancement mode transistor is coupled to a source of the third further enhancement mode transistor.

21. The circuit of claim 20, wherein the enhancement mode transistor conducts between the source and the drain if a gate-source voltage that is applied between the gate and the source is more positive than a positive threshold voltage, and does not conduct between the source and the drain otherwise; and the depletion mode transistor does not conduct between the source and the drain if a gate-source voltage that is applied between the gate and the source is more negative than a negative threshold voltage, and conducts between the source and the drain otherwise.

22. The circuit of claim 20, wherein the source of the enhancement mode transistor is connected to the drain of the further enhancement mode transistor.

23. The circuit of claim 22, further comprising:
a fourth further enhancement mode transistor with a gate-source junction;
wherein the drain of the enhancement mode transistor is connected to a drain of the fourth further enhancement mode transistor; and
wherein the source of the further enhancement mode transistor is connected to a source of the fourth further enhancement mode transistor.

24. The circuit of claim 20, wherein the source of the enhancement mode transistor is connected to the source of the further enhancement mode transistor; and
the drain of the enhancement mode transistor is connected to the drain of the further enhancement mode transistor.

* * * * *